US006482696B2

(12) United States Patent
Park

(10) Patent No.: US 6,482,696 B2
(45) Date of Patent: Nov. 19, 2002

(54) METHOD OF FORMING STORAGE NODES IN A DRAM

(75) Inventor: Young Woo Park, Los Angeles, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/901,048

(22) Filed: Jul. 10, 2001

(65) Prior Publication Data

US 2002/0004280 A1 Jan. 10, 2002

(30) Foreign Application Priority Data

Jul. 10, 2000 (KR) .......................................... 2000-39318

(51) Int. Cl.$^7$ ....................... H01L 21/8242; H01L 21/20
(52) U.S. Cl. ....................... 438/253; 438/254; 438/396; 438/397; 438/692
(58) Field of Search ................................ 438/255, 398, 438/601, 600, 129, 130, 253, 254, 397, 239, 692, 672, 706, 723, 729

(56) References Cited

U.S. PATENT DOCUMENTS

| | | | | |
|---|---|---|---|---|
| 5,763,286 A | * | 6/1998 | Figura et al. ............... | 438/255 |
| 5,773,314 A | * | 6/1998 | Jiang et al. ................. | 438/240 |
| 5,821,160 A | * | 10/1998 | Rodriguez et al. .......... | 438/129 |
| 6,046,083 A | * | 4/2000 | Lin et al. .................... | 438/255 |
| 6,200,898 B1 | * | 3/2001 | Tu .............................. | 438/672 |
| 6,218,197 B1 | * | 4/2001 | Kasai ......................... | 438/253 |
| 6,319,822 B1 | * | 11/2001 | Chen et al. ................. | 438/637 |
| 6,342,419 B1 | * | 1/2002 | Tu .............................. | 257/296 |

FOREIGN PATENT DOCUMENTS

JP          8-321542         12/1996

* cited by examiner

Primary Examiner—Michael S. Lebentritt
(74) Attorney, Agent, or Firm—Volentine Francos, PLLC

(57) ABSTRACT

A method of forming capacitor over bit line storage nodes in dynamic random access memory cell includes forming a multi-layered structure having at least two silicon oxide layers as a thick molding layer, e.g., to a thickness of more than 8000 Å. The at least two silicon oxide layers are disposed to have an etch speed of relatively lower-positioned silicon oxide layer to be relatively faster than that of relatively upper-positioned silicon oxide layer. Holes are then etched in the multi-layered structure, thereby reducing a width differential between the upper and lower layers.

19 Claims, 5 Drawing Sheets

METHOD OF FORMING STORAGE NODES IN A DRAM

This application relies for priority upon Korean Patent Application No. 2000-39318, filed on Jul. 10, 2000, the contents of which are herein incorporated by reference in their entirety.

FIELD OF THE INVENTION

The present invention relates to a method of forming storage nodes in dynamic random access memory (DRAM) cell, and more particularly, to a method of forming a capacitor over bit line (COB) type cylindrical shaped storage nodes by using a silicon oxide layer of more than 8,000 Å as a molding layer.

DESCRIPTION OF THE RELATED ART

As the elements incorporated into a semiconductor device are integrated to a higher degree, the area occupied by capacitors decreases. Accordingly, various methods of increasing the capacitance of the capacitors have been prepared. Among these methods, forming capacitors over bit line to increase the surface area thereof is widely used.

At the start of the COB method, an overlying stacked capacitor structure is formed by depositing a high polysilicon layer and etching it to increase surface area thereof. However, recently the use of cylindrical shaped storage nodes has been adopted. The cylindrical shaped storage nodes are formed by depositing an oxide layer as a molding layer, forming holes in the oxide layer to have contact plugs to be exposed, and forming a conformal conductive layer in holes and on the oxide layer to be connected with the contact plugs.

However, as the aspect ratio of the cylindrical shaped storage node increases with increased integration of the semiconductor device, it becomes difficult to form an ideal cylindrical shaped storage node. One reason for this is that it is difficult to deeply and narrowly etch a molding oxide layer to form contact holes therein. FIG. 1 is a cross-sectional view illustrating an etching problem of a molding layer 20 with holes 18 having a large aspect ratio manufactured in accordance with a conventional method. Due to slope etching, the deeper the molding layer 20 is etched, the narrower the etched holes 18 become. In some cases, contact plugs 25 disposed under the holes 18 are not exposed or are only partially exposed by etching. Then, it can be difficult for the contact plugs 25 to be electrically connected with a conductive layer 22.

In addition to the interrupting of electrical connections between the contact plugs 25 and the conductive layer 22, the narrowed width at lower portions of the etched holes 18 decreases surface areas of the storage nodes composed of the conductive layer 22, thereby decreasing the capacitance thereof.

A method of forming storage node using the slope etching is disclosed in Japanese Patent Laid-open No.08-321542. According to the method, when forming an interlayer insulating layer, a lower layer is a material having relatively large etch speed such as a borophosphosilicate glass (BPSG), while an upper layer is a material having relatively low etch speed such as silicon nitride. Contact holes are formed in the interlayer insulating layer by the slope etching. Since during the etching, the silicon nitride layer generates polymers to form lots of slopes, contact holes having wide widths are formed in the upper silicon nitride layer, and contact holes having a width smaller than the wide width are formed in the lower layer, so that process margin can be increased.

Thus, an object of the conventional method does not prevent problems due to the slope etching, such as decrease of surface area and electrical disconnection, but decreases the width of the contact holes in the lower layer, to thereby increase the process margin by utilizing the slope etching. In addition, problems due to the slope etching still arise when using tetra ethylene ortho silicate layer (TEOS), cited as material having relatively high etch speed in the conventional method, as a molding oxide layer for forming storage nodes.

SUMMARY OF THE INVENTION

The present invention is therefore directed to a method of forming storage nodes in a dynamic random access memory device and resulting structure, which substantially overcomes one or more of the problems due to the limitations and disadvantages of the related art.

It is an object of the present invention to provide an improved method of forming COB type cylindrical shaped storage nodes which can form storage node holes having uniform widths in a tall molding layer, e.g., more than 8,000 Å.

It is another object of the present invention to provide an improved method of forming COB type cylindrical shaped storage nodes which can maintain capacitance of capacitors in DRAM cell at the designed value.

It is another object of the present invention to provide an improved method of forming COB type cylindrical shaped storage nodes which during forming storage node holes, can completely expose upper surfaces of contact plugs, thereby assuring storage nodes formed thereon to be electrically connected therewith.

It is another object of the present invention to provide an improved method of forming COB type cylindrical shaped storage nodes which use a multi-layered oxide layer structure formed to make relatively lower-positioned layer to have etching rate higher than that of relatively upper-positioned layer, as a molding layer, thereby reducing etching time and increasing etching efficiency.

These and other objects may be realized, according to the present invention, by a method of forming COB type cylindrical shaped storage nodes in DRAM cell, including forming a multi-layered structure composed of at least two silicon oxide layers as a thick molding layer, e.g., having a thickness of more than 8,000 Å, and the at least two silicon oxide layers being disposed to have etch speed of relatively lower-positioned silicon oxide layer to be relatively faster than that of relatively upper-positioned silicon oxide layer.

The relatively lower-positioned silicon oxide layer may be formed of BPSG or plasma enhanced oxide (PE-Ox), and the relatively upper-positioned silicon oxide layer may be formed of plasma enhanced tetra ethylene ortho silicate (PE-TEOS).

Also, the multi-layered structure may be formed to a thickness of more than 20,000 Å.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be through and complete, and will fully convey the scope of the invention to those skilled in the art. Like numbers refer to like elements throughout.

Figure 1:
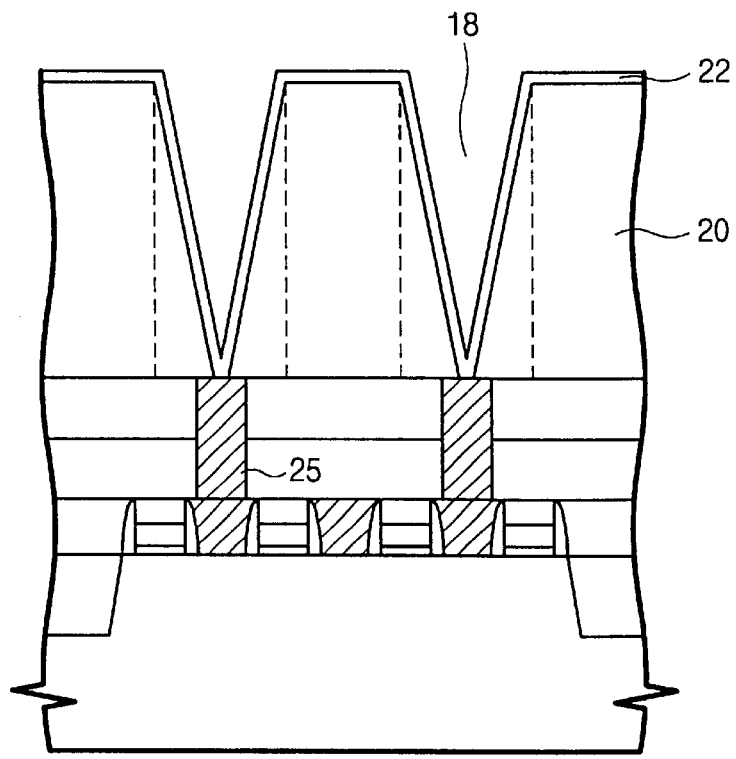
FIG. 1 is a cross-sectional view of a DRAM cell manufactured by a conventional method of forming storage nodes.
Figure 2:
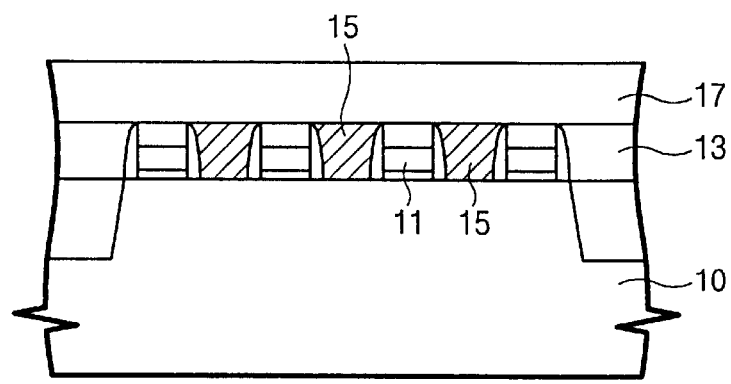
FIG. 2 to FIG. 7 are flow diagrams showing the process steps of a method of forming COB type cylindrical shaped storage nodes in accordance with the present invention.

Referring now to FIG. 2, a first interlayer insulating layer 13 is deposited over a substrate on which metal-oxide semiconductor (MOS) transistors are formed, in order to form dynamic random access memory (DRAM) cells. The first interlayer insulating layer 13 fills spaces between a gate pattern 11. Then, self-aligned contact pads 15 are formed at source/drain portions in an active region by patterning the first interlayer insulating layer 13, depositing a conductive layer, and carrying out a planarization.

Thereafter, a second interlayer insulating layer 17 is deposited over the substrate 10 on which the self-aligned contact pads 15 are formed. Bit line contact holes (not shown) are formed to have bit line contact pads to be exposed by patterning. Then, bit line contact plugs along with bit lines (not shown) are formed by depositing a conductive layer and patterning it.

Figure 3:
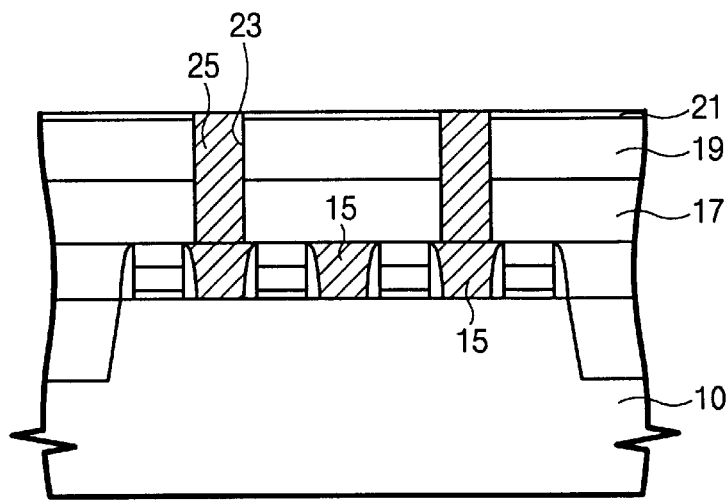

Referring to FIG. 3, a third interlayer insulating layer 19 is formed on the bit lines not shown. Then, an etch stop layer 21 is formed on the third interlayer insulating layer 19. The etch stop layer 21 may be a silicon nitride layer having a thickness of 50 Å–500 Å. Thereafter, storage contact holes 23 which penetrate the second and third interlayer insulating layers 17, 19 are formed by patterning to expose the self-aligned contact pads 15. A polysilicon layer is deposited to fill the storage contact holes 23 over the substrate 10. The polysilicon layer formed on the etch stop layer 21 is removed by a planarization etch process, so that only the storage contact plugs 25 remain.

Figure 4:
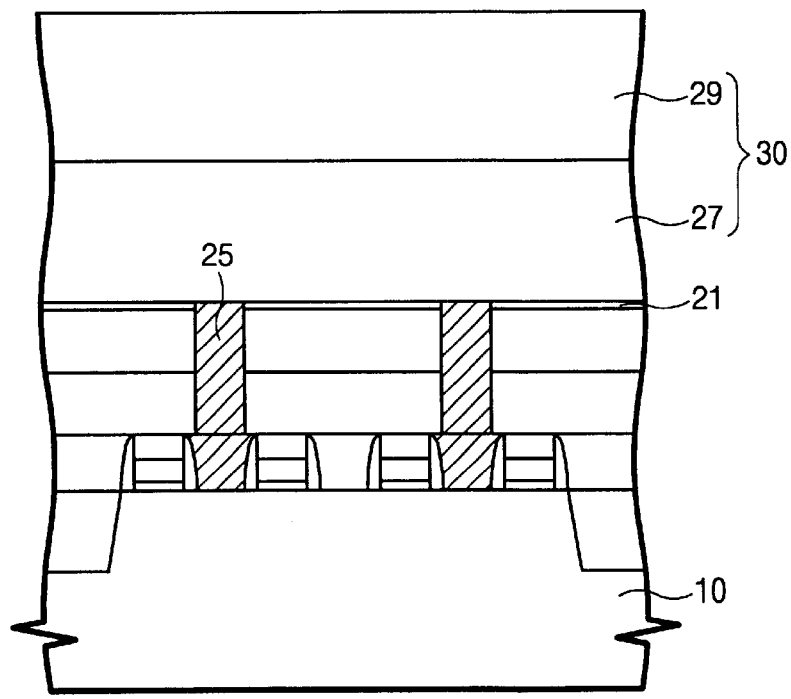

Referring to FIG.4, a molding layer 30 is formed of at least two silicon oxide layers on the storage contact plugs 25 and the etch stop layer 21. As shown in the embodiment in FIG. 4, the molding layer 30A includes a lower layer 27 and an upper layer 29. In all etch processes including a dry and a wet etch, the lower layer 27 has a high etch selectivity compared with the upper layer 29. Therefore, once the upper layer 29 has been etched to a depth at which the lower layer 27 is exposed, the etching speed can be accelerated. This accelerated etching reduces the problem that the width of lower portions of the storage nodes decreases more than that of upper portions of the storage nodes by slope etching. In an exemplary embodiment, the lower layer 27 is a 10,000 Å thick BPSG or PE-Ox layer and the upper layer 29 is a 10,000 Å–20,000 Å thick PE-TEOS layer.

The lower layer 27 can be formed using BPSG under atmospheric pressure, at 400° C. and a tri-ethyl borate (TEB)/a tri-methyl ortho phosphate (TMOP)=12.5 standard liter per minute (slm)/5.9 slm or 11.3 slm/5.2 slm. The lower layer 27 could also be formed using PE-Ox under 2.2 Torr pressure, at 400° C., a gap between head and wafer is 535 mils, source gases are $SiH_4$ 115 sccm (standard cubic centimeter per minute) and $N_2O$ 1,700 sccm, and supplied power is 296 W. The upper layer 29 can be formed using PE-TEOS of thickness of 10,000 Å or 20,000 Å under 2.2 Torr pressure, at 390° C., $O_2$ is 10.0 slm, TEOS is 1.8 slm and supplied power is 450 W–650 W.

Figure 5:
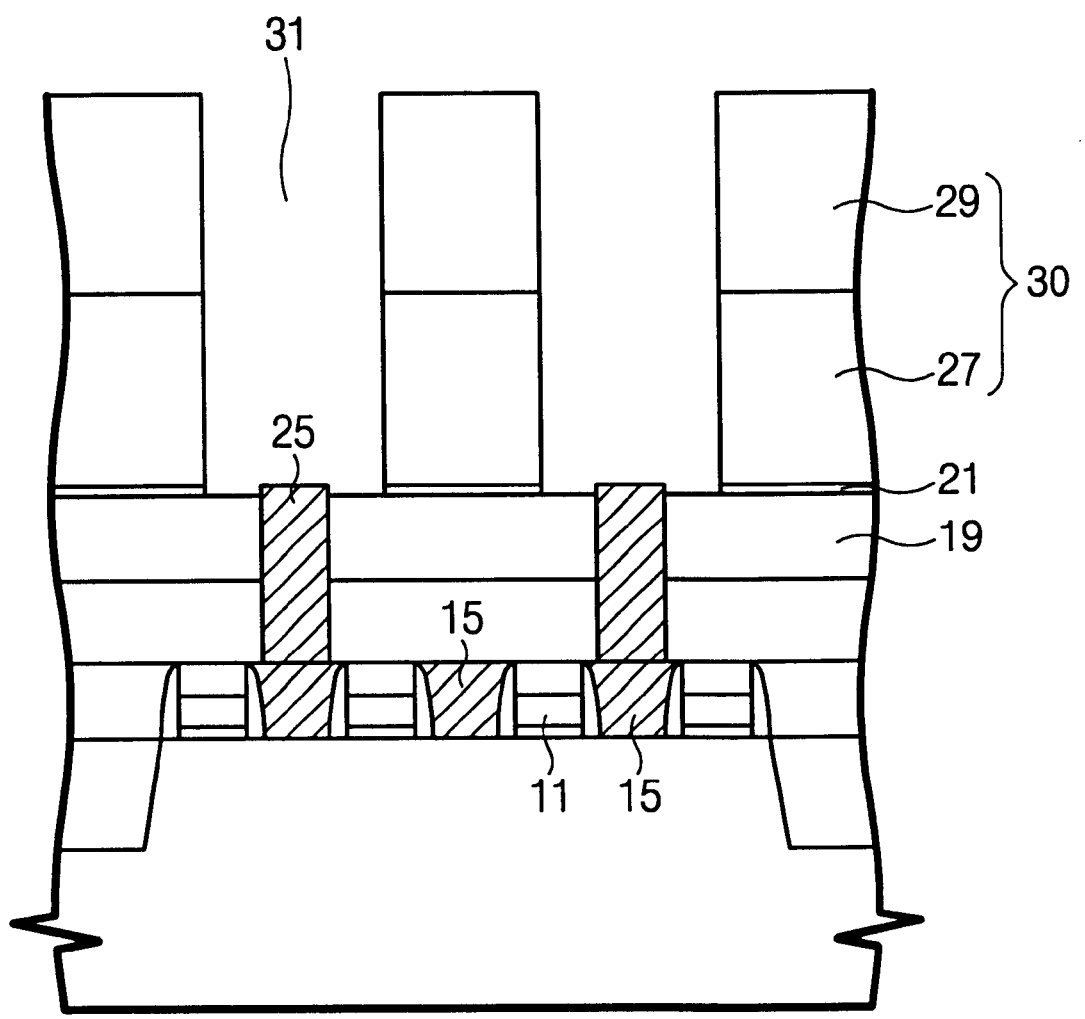

Referring to FIG. 5, storage node holes 31 are formed in the lower layer 27 and the upper layer 29 by etching the layers 27 and 29. The etch stop layer 21 exposed by the oxide layer etching also is removed by etching. Accordingly, the storage contact plugs 25 positioned under the storage node holes 31 are exposed. At this time, the oxide layer etching is carried out by forming a photoresist pattern as a mask on the molding layer 30.

If a silicon nitride layer or a silicon nitride oxide layer is formed as an anti-reflection layer before forming the photoresist pattern, the storage node holes 31 formation includes an anti-reflective layer etching and polymer attaching step, and a storage node hole forming step. For example, the anti-reflective layer etching and polymer attaching step is carried out for eighty seconds under 50 mTorr pressure, with a source power for forming the plasma of 1,200 Ws, a bias power for accelerating atoms of the plasma of 1,500 Wb, and a mix rate of $CH_2F_2$, $O_2$, Ar, and $CHF_3$ of 40:10:300:40. The storage node hole forming step is carried out for five minutes under 20 mTorr pressure, with a source power for forming the plasma of 900 W, a bias power for accelerating atoms of the plasma of 1,500 W, and a mix rate of $C_5F_8$, $O_2$, and Ar of 15:15:500. Etching equipment used during the two steps for forming the storage node holes is SCCM or AIEM manufactured by TEL Co., Ltd.

As explained above, the storage node holes 31, each having an upper portion width being almost the same as a lower portion width, are formed in the molding layer 30. As noted above, the molding layer may be composed of a silicon oxide layer of 26,000 Å or 36,000 Å. The etch stop layer 21 disposed on the third interlayer insulating layer 19 is also etched. After the storage node holes 31 are formed, the photoresist pattern for etching the storage node holes 31 disposed on the molding layer 30 is removed.

Figure 6:
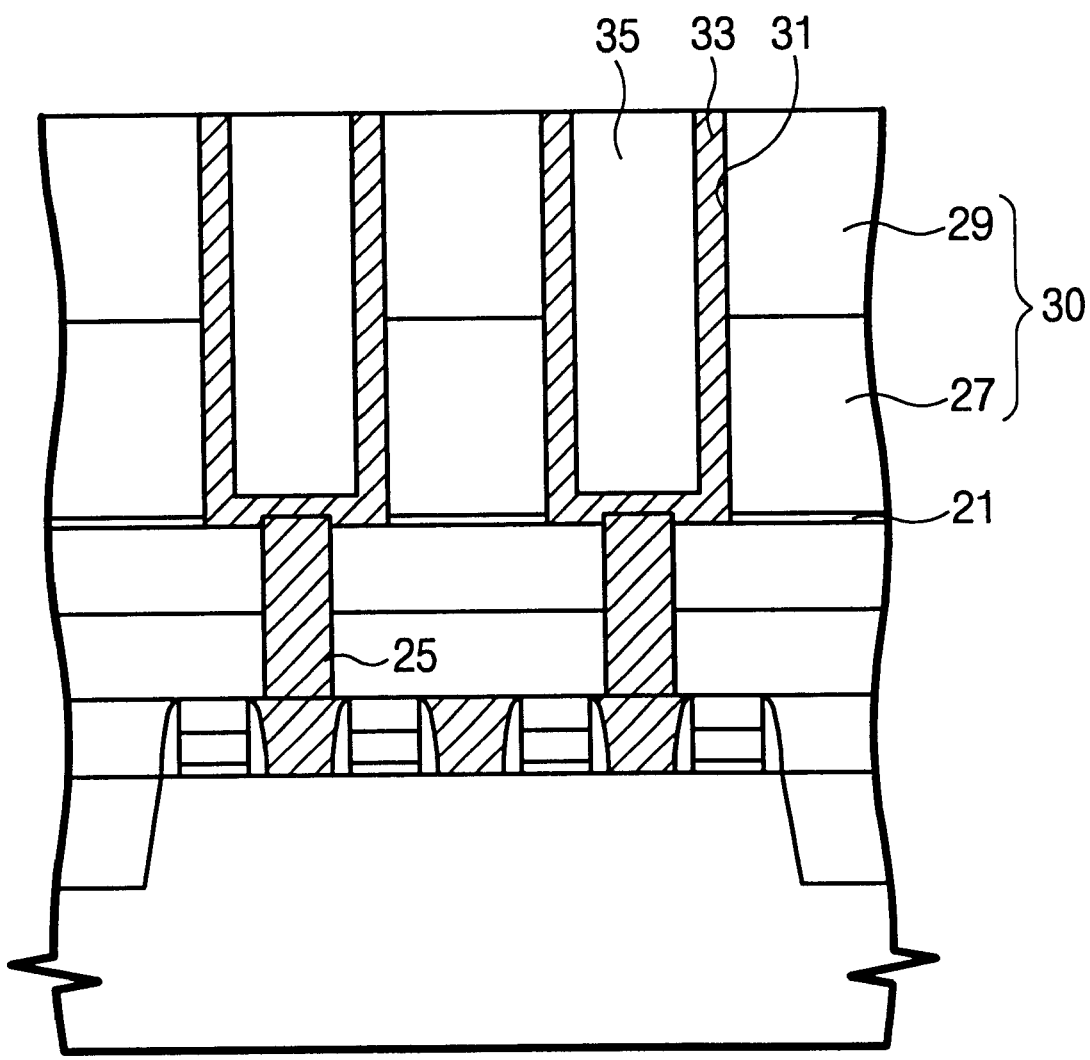

Referring to FIG. 6, a conformal polysilicon layer is deposited over the substrate over which the storage node holes 31 are formed. Then, the conformal polysilicon layer formed on upper surface of the molding layer 30 is removed to separate the storage nodes 33 from each other.

Since each storage node hole 31 has very large aspect ratio, it is difficult to form the storage nodes 33 as well as the storage node holes 31. However, polysilicon is able to easily fill small gaps, so that the conformal polysilicon layer can be easily formed in the storage node holes 31 and on upper surface of the molding layer 30. Thereafter, in order to expose the upper surface of the molding layer 30, the conformal polysilicon layer formed on the upper surface of the molding layer 30 is etched. However, when etch back is carried out to the conformal polysilicon layer just after it is formed in the storage node holes 31 and on the upper surface of the molding layer 30, portions of the conformal polysilicon layer disposed on bottoms of the storage node holes 31 can be also etched to electrically disconnect the storage nodes 33 from the contact plugs 25. Therefore, carrying out the etch back just after forming the conformal polysilicon layer is not preferable.

Accordingly, etching after filling small gaps of the conformal polysilicon layer in the storage node holes 31 with a silicon oxide layer can be considered as a possible solution. However, there is still a problem that it is difficult to fill the small gaps of the conformal polysilicon layer with the silicon oxide layer.

Another method of removing the conformal polysilicon layer formed on upper surface of the molding layer 30 is chemical-mechanical planarization or polishing (CMP). However, CMP requires removal of slurry particles during a subsequent process.

Accordingly, it is preferable to form a photoresist layer over the substrate to fill the small gaps of the polysilicon layer in the storage node holes 31 and remove the photoresist layer along with the conformal polysilicon layer by a planarization etch process. During the planarization etch process, the photoresist layer is etched using oxygen plasma until the polysilicon layer is exposed. Then further removal is carried out using a process, e.g., an anisotropic etching or CMP, which does not have a different etch selectivity with respect to the polysilicon layer and the photoresist layer. After the storage nodes 33 are separated from each other, portions of the photoresist layer which fill the small gaps are removed by stripping.

Figure 7:
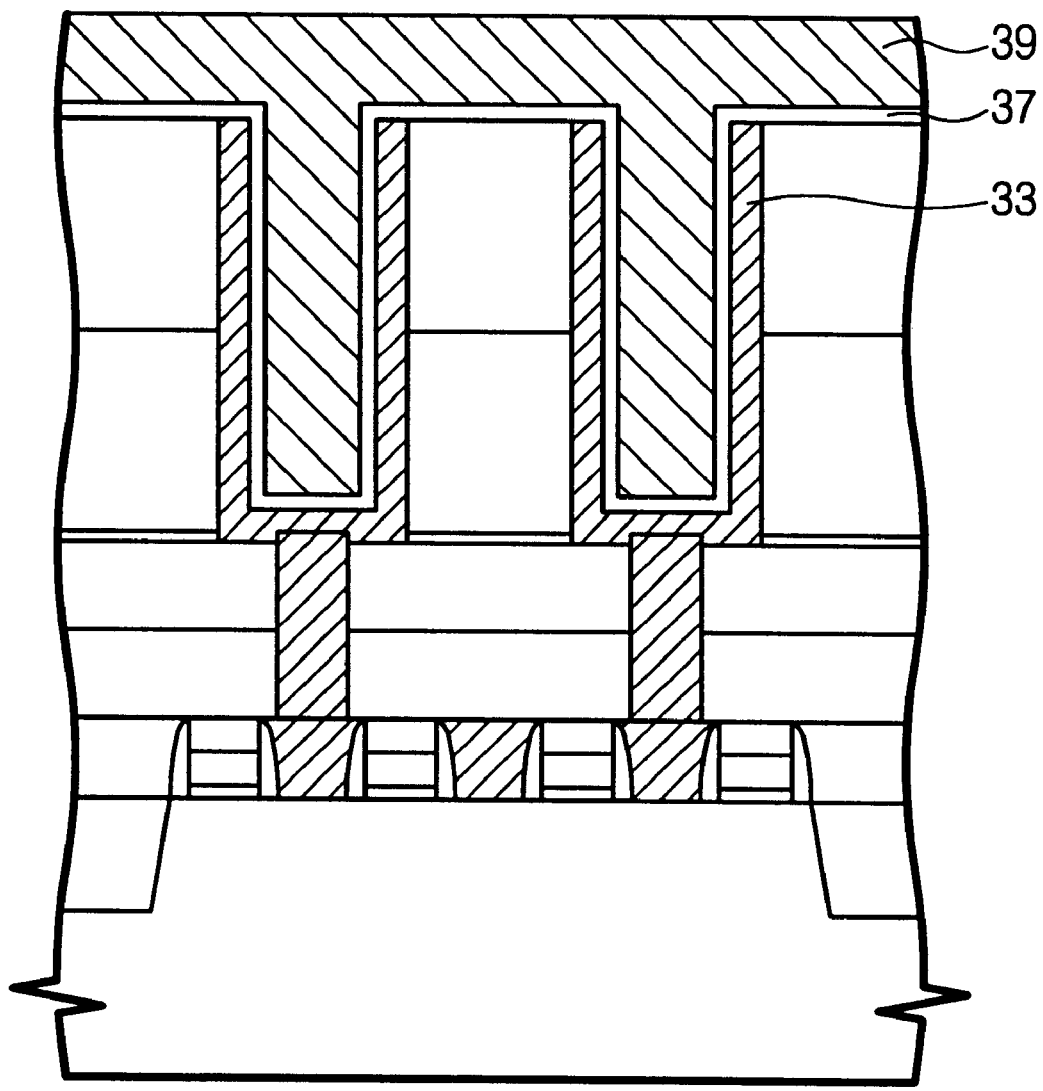

Referring to FIG. 7, a capacitor dielectric layer 37 is formed over the substrate over which the storage nodes 33 are separated from each other. Then, a plate electrode 39, e.g., a polysilicon layer, is deposited to form an opposite electrode structure with the storage nodes 33. Alternatively, hemi-spherical grains, used to increase surface areas of the storage nodes 33, can be formed before the dielectric layer 37 is deposited.

It will be noted that in an exemplary embodiment of the invention, a molding layer is explained as a double-layered structure having a lower PE-Ox or BPSG layer and an upper PE-TEOS layer, but the invention is not limited only to the embodiment. For example, other double-layered oxide layer structure including a lower layer which has relatively high etch selectivity, i.e., etch speed can be used. Also, multi-layered silicon oxide layer structure formed to make etch speed of relatively upper-positioned layer to be lower than that of relatively lower-positioned layer by varying impurity elements and forming conditions can be used as a molding layer.

As apparent from the foregoing description, it can be appreciated that the present invention provides a method of forming COB type cylindrical shaped storage nodes in DRAM cell which can remarkably reduce the difference between the widths of upper and lower portions of the storage nodes by a slope etching, thereby carrying out effectively etch process for exposing contact plugs. In particular, by having lower layers of the molding layer being composed of material having a faster etch speed than material of the upper layers, the width throughout the hole can be substantially maintained, even though the upper layers undergo more etching.

Also, the present invention provides a method of forming COB type cylindrical shaped storage nodes in DRAM cell which can form cylindrical shaped storage node holes having uniform widths in a molding layer, thereby maintaining capacitance of capacitors in the DRAM cell at the designed value.

In the drawings and specification, there has been disclosed typical preferred embodiment of the invention and, although specific terms are employed, they are used in a generic and descriptive sense only and not for purpose of limitation, the scope of the invention being set forth in the following claims.

What is claimed is:

1. A method for use in forming storage nodes in a dynamic random access memory device, the method comprising:
   forming a multi-layered structure composed of at least a lower silicon oxide layer of BPSG (Boro-Phospo Silicate Glass) and an upper silicon oxide layer of PE-TEOS (Plasma Enhanced Tetra Ethyl Ortho Silicate) as a molding layer on a substrate having contact plugs thereon; and
   etching said multi-layered structure to form holes therethrough that expose said contact plugs, respectively, wherein the etching of the lower silicon oxide layer of BPSG is relatively faster than that of the upper silicon oxide layer of PE-TEOS.

2. The method of claim 1, wherein said BPSG layer is formed under a condition of a ratio of flow rate of TEB (Tetra-Ethyl Borate)/flow rate of TMOP (Tetra Methyl Ortho Phosphate)=12.5 slm/5.9 slm or 11.3 slm/5.2 slm.

3. The method of claim 1, wherein said multi-layered structure has a thickness of more than 8,000 Å.

4. The method of claim 3 wherein said multi-layered structure has a thickness of more than 20,000 Å.

5. The method of claim 1, further comprising depositing a conformal polysilicon layer over the holes in the multi-layered structure.

6. The method of claim 5, further comprising removing a portion of the conformal polysilicon layer to separate storage nodes.

7. The method of claim 6, wherein said removing of the conformal polysilicon layer comprises forming a photoresist layer over the conformal polysilicon layer and etching the photoresist layer and the polysilicon layer.

8. The method of claim 7, wherein said etching of the photoresist layer and the polysilicon layer includes using an etch process having substantially the same etch selectivity for the photoresist layer and the polysilicon layer.

9. The method of claim 7, further comprising stripping photoresist remaining after said etching of the photoresist layer and the polysilicon layer.

10. The method of claim 1, further comprising, before said etching of the molding layer, forming an anti-reflection layer thereon.

11. A method for use in forming storage nodes in a dynamic random access memory device, the method comprising:
   forming a multi-layered structure composed of at least a lower silicon oxide layer of PE-Ox (Plasma Enhanced Oxide) and an upper silicon oxide layer of PE-TEOS (Plasma Enhanced Tetra Ethyl Ortho Silicate) as a molding layer on a substrate having contact plugs thereon; and
   etching said multi-layered structure to form holes therethrough that expose said contact plugs, respectively, wherein the etching of the lower silicon oxide layer of PE-Ox is relatively faster than that of the upper silicon oxide layer of PE-TEOS.

12. The method of claim 11, wherein said multi-layered structure has a thickness of more than 8,000 Å.

13. The method of claim 12, wherein said multi-layered structure has a thickness of more than 20,000 Å.

14. The method of claim 11, further comprising depositing a conformal polysilicon layer over the holes in the multi-layered structure.

15. The method of claim 14, further comprising removing a portion of the conformal polysilicon layer to separate storage nodes.

16. The method of claim 15, wherein said removing of the conformal polysilicon layer comprises forming a photoresist layer over the conformal polysilicon layer and etching the photoresist layer and the polysilicon layer.

17. The method of claim 16, wherein said etching of the photoresist layer and the polysilicon layer includes using an etch process having substantially the same etch selectivity for the photoresist layer and the polysilicon layer.

18. The method of claim 16, further comprising stripping photoresist remaining after said etching of the photoresist layer and the polysilicon layer.

19. The method of claim 11, further comprising, before said etching of the molding layer, forming an anti-reflection layer thereon.

* * * * *